United States Patent
Chang

[11] Patent Number: 6,154,363
[45] Date of Patent: Nov. 28, 2000

[54] ELECTRONIC DEVICE COOLING ARRANGEMENT

[76] Inventor: Neng Chao Chang, No. 6, Lane 189, Sec. 2, Chung Yang Rd., Tu Cheng City, Taipei Hsien, Taiwan

[21] Appl. No.: 09/474,252

[22] Filed: Dec. 29, 1999

[51] Int. Cl.$^7$ .................................................. H05K 7/20
[52] U.S. Cl. ........................ 361/699; 361/689; 361/702; 257/714; 174/15.1; 165/80.4
[58] Field of Search ..................... 361/689, 690, 361/694, 698, 699, 701, 702, 703, 707, 711; 257/714–716, 721; 174/15.1; 165/80.4

[56] References Cited

U.S. PATENT DOCUMENTS

| | | | |
|---|---|---|---|
| 3,481,393 | 12/1969 | Chu ........................................ | 165/80.4 |
| 4,072,188 | 2/1978 | Wilson et al. ............................ | 165/80 |
| 5,089,936 | 2/1992 | Kojima et al. ........................... | 361/705 |
| 5,249,100 | 9/1993 | Satoh et al. .............................. | 361/689 |
| 5,365,402 | 11/1994 | Hatada et al. ........................... | 361/699 |
| 5,457,342 | 10/1995 | Herbst, II ................................ | 257/712 |
| 5,640,303 | 6/1997 | Hooley ..................................... | 361/699 |
| 5,731,954 | 3/1998 | Cheon ...................................... | 361/699 |
| 5,870,823 | 2/1999 | Bezama et al. .......................... | 29/848 |

FOREIGN PATENT DOCUMENTS

| | | | |
|---|---|---|---|
| 403159160A | 7/1991 | Japan ...................................... | 257/714 |

*Primary Examiner*—Lee P. Picard
*Assistant Examiner*—Boris L. Chervinsky
*Attorney, Agent, or Firm*—Rosenberg, Klein & Lee

[57] ABSTRACT

An electronic device cooling arrangement, which includes a flat, rectangular metal water container attached to an electronic device, for example, a CPU for carrying heat away from the CPU, the metal water container having a thinner middle portion for causing a venturi effect upon flowing of water through the metal water container, a first plug installed in one thicker lateral portion of the metal water container for guiding a flow of cooling water from an external water source into the metal water container, and a second plug installed in an opposite thicker lateral portion of the metal water container remote from the first plug for guiding the intake flow of cooling water out of the metal water container for enabling heat to be carried away from the CPU with the output flow of cooling water.

5 Claims, 4 Drawing Sheets

ELECTRONIC DEVICE COOLING ARRANGEMENT

BACKGROUND OF THE INVENTION

The present invention relates to an electronic device cooling arrangement, and more particularly to such an electronic device cooling arrangement, which uses a venturi effect to accelerate the velocity of a flow of cooling water passing through a flat metal container on an electronic device, enabling heat to be quickly carried away with the running flow of cooling water from the electronic device.

When an electronic device, for example, an IC or CPU works, it produces much heat. Heat must be quickly carried away so as not to affect normal function of the electronic device. According to tests, when the temperature of an electronic device surpasses 10° over the rated working temperature, the service life of the electronic device will be shortened by half. FIG. 1 shows a CPU cooling arrangement according to the prior art. According to this arrangement, a heat sink 12 is closely attached to the top sidewall of the CPU 14 and secured in place by clamp means, and a fan 10 is mounted on the heat sink 12 to cause currents of air, enabling heat to be quickly carried away from the CPU 14 through the heat sink 12 into the air. This CPU cooling arrangement is still not satisfactory in function. Because the heat sink and the fan are arranged in a stack and mounted on the CPU at the topside, much installation space is required. During the operation of the CPU, the temperature of the CPU may vary with the ambient temperature, and a sudden increase of temperature may cause the CPU to fail. Further, this arrangement cannot effectively carry heat away from the CPU 14 when in a poor ventilation surrounding.

SUMMARY OF THE INVENTION

The present invention has been accomplished to provide an electronic device cooling arrangement, which eliminates the aforesaid drawbacks. According to one aspect of the present invention, a flat, rectangular metal water container is used and attached to the electronic device from which heat is to be carried away, enabling heat to be quickly carried away from the electronic device with a running flow of cooling water passing through the metal water container. According to another aspect of the present invention, the metal water container has a narrower middle portion for causing a venturi effect to accelerate the flowing velocity of the running flow of cooling water passing through. According to still another aspect of the present invention, a conventional clamp is used to fix the metal water container to the electronic device from which heat is to be carried away.

DETAILED DESCRIPTION OF THE PREFERRED EMBODIMENT

Figure 1:
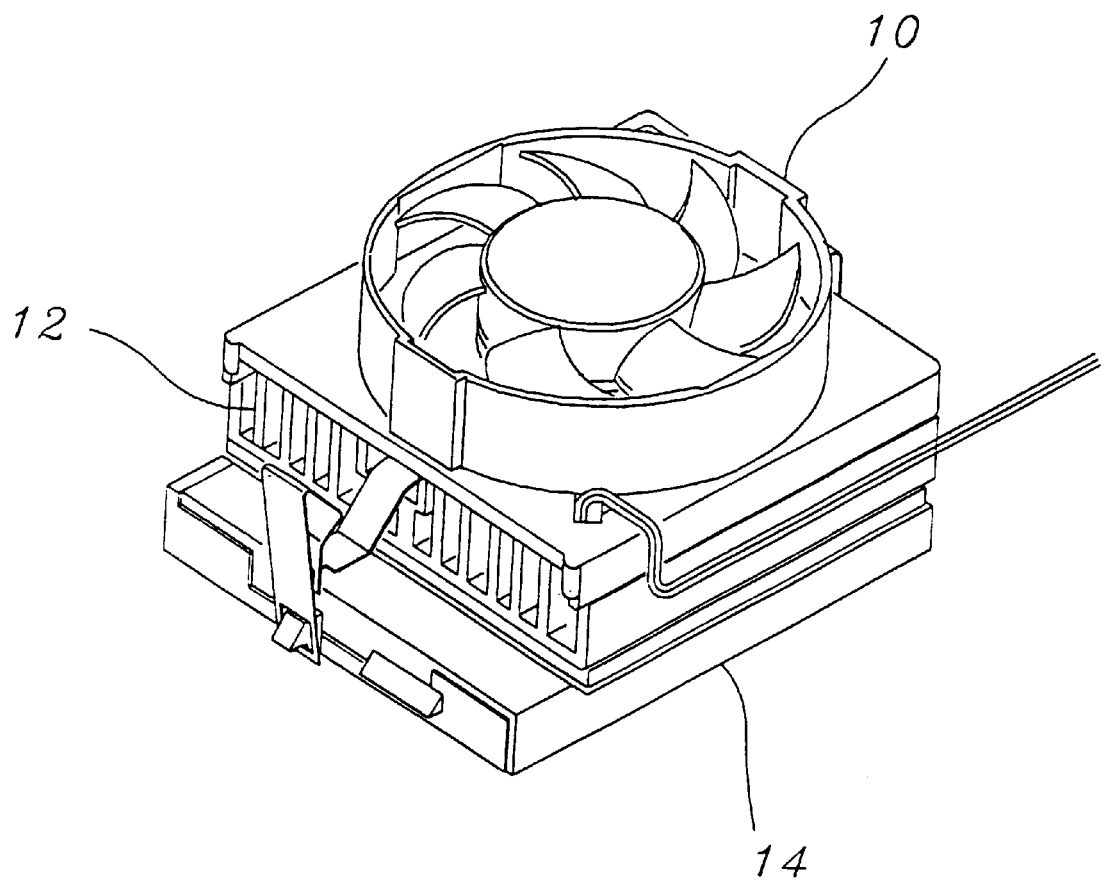
FIG. 1 illustrates a CPU cooling arrangement according to the prior art.
Figure 2:
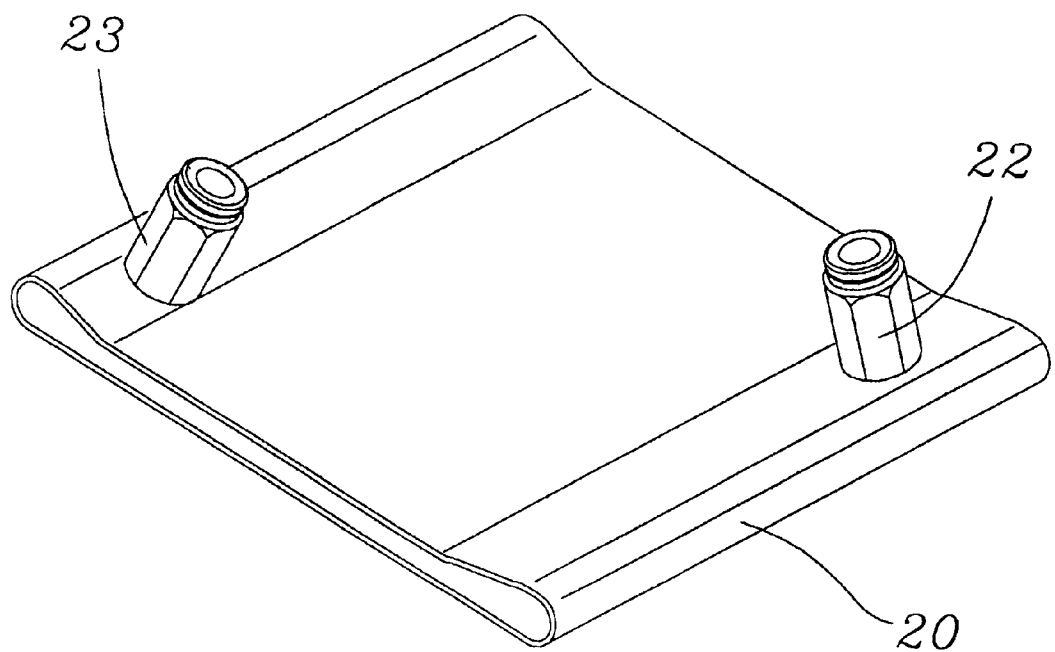
FIG. 2 is a propective view of the present invention.
Figure 3:
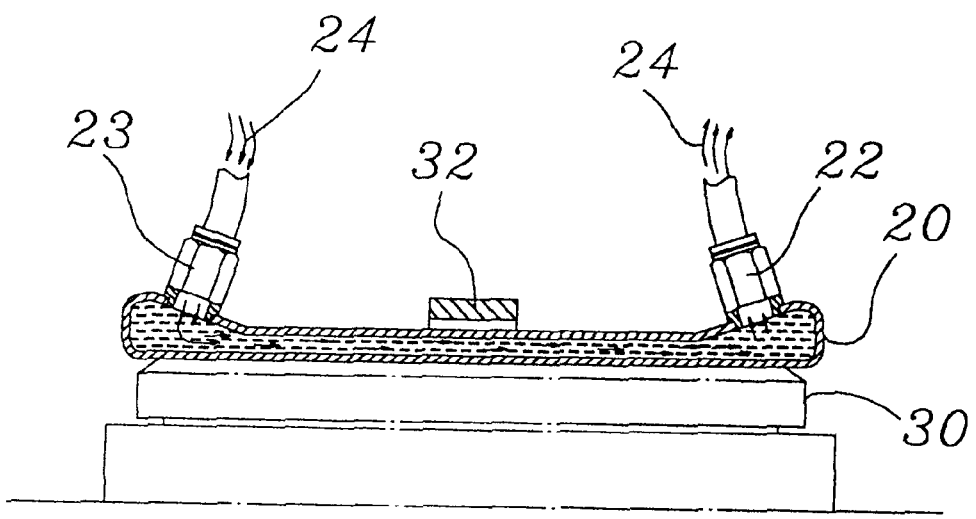
FIG. 3 is an installed view in section of the present invention, showing the metal water container fastened to a CPU.

Referring to FIGS. 2 and 3, the present invention comprises a flat, rectangular metal water container 20, a first plug 22, a second plug 23, and a clamp 32. The two opposite lateral portions of the metal water container 20 have a thickness (height) greater than the middle part thereof. The metal water container 20 has a flat bottom sidewall. When in use, the metal water container 20 is secured in place by the clamp 32, keeping the flat bottom sidewall of the metal water container 20 in close contact with the CPU 30. The first plug 22 and the second plug 23 are respectively diagonally installed in the thicker lateral portions of the metal water container 20 at the top. A flow of water 24 is delivered from a water source through the first plug 22 into the metal water container 20, and then forced out of the metal water container 20 through the second plug 23. When the flow of water 24 passing from the first plug 22 through the thinner middle portion of the metal container 20 to the second plug 22, the velocity of the flow of water 24 is relatively increased due to venturi effect, enabling heat to be quickly carried away from the CPU 30 through the running flow of water 24 via the metal water container 20. Because the temperature of the flow of water 24 is lower than room temperature, it is not necessary to provide cold air to the inside of the computer, and the running flow of water 24 is sufficient to effectively quickly carry heat away from the CPU 30.

Figure 4:
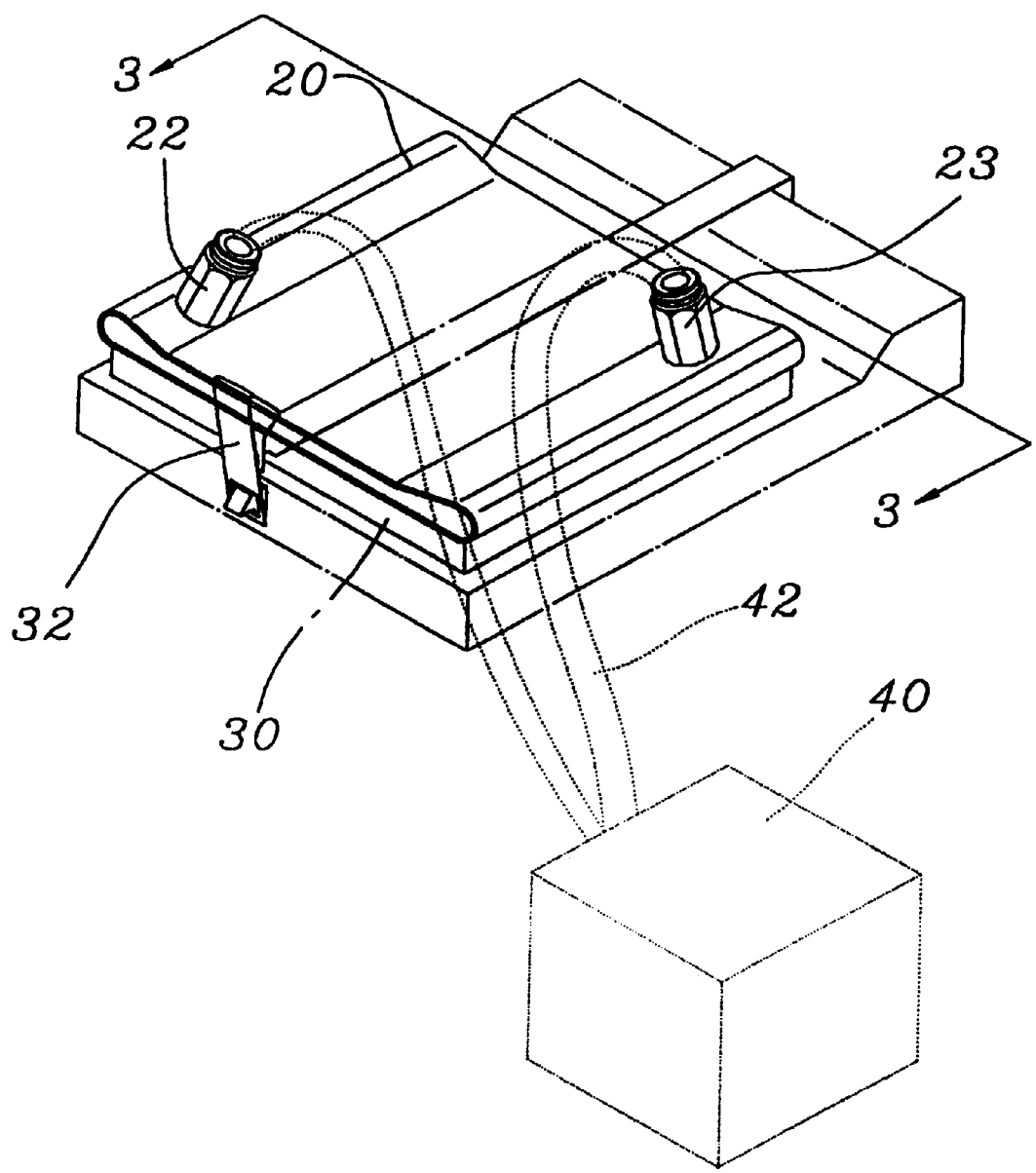
FIG. 4 is an applied view of the present invention, showing the metal water container fastened to a CPU, the first plug and the second plug connected to a water tank.

Referring to FIG. 4, the metal water container 20 is fastened to the CPU 30 by a clamp 32, keeping the flat bottom sidewall of the metal water container 20 in close contact with the flat top sidewall of the CPU 30, the first plug 22 and the second plug 23 are respectively connected to a water tank 40 through a respective hose 42. A water pump (not shown) is installed in the water tank 40 to pump water from the water tank 40 into the first plug 22, enabling the output flow of water to flow through the metal water container 20 and then to flow back to the water tank 40 through the second plug 23. During circulation of water, heat is carried away with water from the CPU 30.

The present invention can also be used to carry from any of other electronic devices that produce heat when working. For example, the invention can be used to carry heat from an IC, a 3D video card, etc.

It is to be understood that the drawings are designed for purposes of illustration only, and are not intended for use as a definition of the limits and scope of the invention disclosed.

What the invention claimed is:

1. An electronic device cooling arrangement comprising:
   a flat, rectangular metal water container attached to an electronic device for carrying heat away from the electronic device, said metal water container having a thinner middle portion and two thicker lateral portions at two opposite lateral sides of said thinner middle portion;
   a first plug installed in one thicker lateral portion of said metal water container for guiding a flow of cooling water into said metal water container; and
   a second plug installed in one thicker lateral portion of said metal water container remote from said first plug for guiding intake flow of cooling water out of said metal water container.

2. The electronic device cooling arrangement of claim 1 wherein said metal water container is a copper water container.

3. The electronic device cooling arrangement of claim 1 wherein said metal water container is an aluminum water container.

4. The electronic device cooling arrangement of claim 1 further comprising clamp means for securing said metal water container to the electronic device.

5. The electronic device cooling arrangement of claim 1 further comprising a water inlet pipe means for guiding a flow of cooling water from an external water source to said first plug and said metal water container, and a water outlet pipe means for guiding the intake flow of cooling water out of said metal water container and said second plug.

* * * * *